United States Patent
Parks

(10) Patent No.: US 7,357,115 B2
(45) Date of Patent: Apr. 15, 2008

(54) WAFER CLAMPING APPARATUS AND METHOD FOR OPERATING THE SAME

(75) Inventor: John Parks, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 674 days.

(21) Appl. No.: 10/404,402

(22) Filed: Mar. 31, 2003

(65) Prior Publication Data

US 2004/0187894 A1    Sep. 30, 2004

(51) Int. Cl.
B08B 3/04    (2006.01)
(52) U.S. Cl. ...................... 123/200; 134/902
(58) Field of Classification Search ............... 134/902, 134/200, 113
See application file for complete search history.

(56) References Cited

U.S. PATENT DOCUMENTS

| | | | | |
|---|---|---|---|---|
| 3,747,282 A * | 7/1973 | Katzke | ................ | 451/388 |
| 4,183,545 A * | 1/1980 | Daly | ................ | 279/3 |
| 4,433,835 A * | 2/1984 | Wheeler | ................ | 269/14 |
| 4,707,012 A * | 11/1987 | Takagi | ................ | 294/64.1 |
| 4,870,923 A * | 10/1989 | Sugimoto | ................ | 118/715 |
| 4,906,011 A * | 3/1990 | Hiyamizu et al. | ........ | 279/3 |
| 4,986,216 A * | 1/1991 | Ohmori et al. | ............ | 118/730 |
| 5,133,829 A * | 7/1992 | Geyling | ................ | 117/46 |
| 5,169,408 A * | 12/1992 | Biggerstaff et al. | ........ | 29/25.01 |
| 5,201,994 A * | 4/1993 | Nonaka et al. | ............. | 216/69 |
| 5,230,741 A * | 7/1993 | van de Ven et al. | ........ | 118/728 |
| 5,374,829 A * | 12/1994 | Sakamoto et al. | ..... | 250/453.11 |
| 5,445,677 A * | 8/1995 | Kawata et al. | ............. | 118/724 |
| 5,738,165 A * | 4/1998 | Imai | .................. | 165/80.2 |
| 5,822,172 A * | 10/1998 | White | ................ | 361/234 |
| 5,883,017 A * | 3/1999 | Tepman et al. | ............ | 438/800 |
| 5,936,829 A * | 8/1999 | Moslehi | ................ | 361/234 |
| 6,015,503 A * | 1/2000 | Butterbaugh et al. | ........ | 216/66 |
| 6,024,631 A | 2/2000 | Piper | | |
| 6,032,997 A | 3/2000 | Elliott et al. | | |
| 6,067,728 A * | 5/2000 | Farmer et al. | ............. | 34/470 |
| 6,113,698 A * | 9/2000 | Raaijmakers et al. | ....... | 118/715 |
| 6,192,601 B1 * | 2/2001 | Ghanayem et al. | ........... | 34/406 |
| 6,239,038 B1 * | 5/2001 | Wen | ................ | 438/745 |
| 6,271,676 B1 * | 8/2001 | Montoya | ................ | 324/765 |
| 6,279,976 B1 | 8/2001 | Ball | | |
| 6,306,564 B1 * | 10/2001 | Mullee | ................ | 430/329 |
| 6,398,926 B1 * | 6/2002 | Mahneke | ................ | 204/224 R |

(Continued)

FOREIGN PATENT DOCUMENTS

EP    0408350 A2    1/1991

(Continued)

*Primary Examiner*—Frankie L. Stinson
(74) *Attorney, Agent, or Firm*—Martine Penilla & Gencarella, LLP

(57) ABSTRACT

A wafer clamping apparatus is provided to secure a wafer within a chamber during wafer processing. The wafer clamping apparatus creates a pressure differential between a top surface and a bottom surface of the wafer. The pressure differential serves to pull the wafer toward a wafer support structure in contact with the wafer bottom surface, whereby the wafer is secured and maintained in an immobile state. The wafer clamping apparatus also includes options for controlling the pressure differential between the top and bottom surfaces of the wafer. The wafer clamping apparatus is implemented without requiring contact with the wafer top surface and with minimal increase in chamber design complexity.

16 Claims, 9 Drawing Sheets

U.S. PATENT DOCUMENTS

| | | | |
|---|---|---|---|
| 6,497,239 B2 * | 12/2002 | Farmer et al. | 134/56 R |
| 6,524,429 B1 * | 2/2003 | Nogami et al. | 156/345.11 |
| 6,527,625 B1 * | 3/2003 | Kajiwara et al. | 451/41 |
| 6,550,484 B1 * | 4/2003 | Gopinath et al. | 134/1.2 |
| 6,576,345 B1 * | 6/2003 | Van Cleemput et al. | 428/447 |
| 6,722,642 B1 * | 4/2004 | Sutton et al. | 269/21 |
| 6,784,096 B2 * | 8/2004 | Chen et al. | 438/637 |
| 6,848,458 B1 * | 2/2005 | Shrinivasan et al. | 134/108 |
| 6,921,456 B2 * | 7/2005 | Biberger et al. | 156/345.26 |
| 2003/0037457 A1 | 2/2003 | Bailey et al. | |
| 2003/0047551 A1 | 3/2003 | Worm et al. | |
| 2004/0157463 A1 * | 8/2004 | Jones | 438/716 |

FOREIGN PATENT DOCUMENTS

| | | |
|---|---|---|
| EP | 0463853 A1 | 1/1992 |
| EP | 0825279 A1 | 2/1998 |
| WO | WO-00/05750 | 2/2000 |
| WO | WO-02/059947 | 8/2002 |

* cited by examiner

WAFER CLAMPING APPARATUS AND METHOD FOR OPERATING THE SAME

BACKGROUND OF THE INVENTION

1. Field of the Invention

The present invention relates generally to semiconductor wafer cleaning. More specifically, the present invention relates to an apparatus for clamping a wafer in a wafer processing chamber and a method for operating the wafer clamping apparatus.

2. Description of the Related Art

In the manufacture of semiconductor devices, a surface of a semiconductor wafer ("wafer" or "substrate")must be cleaned to remove chemical and particulate contamination. If the contamination is not removed, semiconductor devices on the wafer may perform poorly or become defective. Particulate contamination generally consists of tiny bits of distinctly defined material having an affinity to adhere to the surface of the wafer. Examples of particulate contamination can include organic and inorganic residues, such as silicon dust, silica, slurry residue, polymeric residue, metal flakes, atmospheric dust, plastic particles, and silicate particles, among others.

Some types of wafer cleaning processes are performed in a sealed chamber. An important aspect of the chamber design is the method by which the wafer is held or clamped within the chamber. The wafer should be held securely within the chamber to prevent lifting or mobilization of the wafer. With lifting or mobilization, the wafer is exposed to a significant risk of damage. Also, lifting of the wafer will cause the backside of the wafer to be more exposed to cleaning fluids and by-products within the chamber. Exposure of the backside of the wafer to cleaning fluids and by-products can result in increased contamination and cleaning difficulty. Thus, it is important to securely hold the wafer within the chamber during processing.

One conventional option for securing the wafer within the chamber includes clamping the wafer through contact with the wafer top surface. Using clamps in contact with the wafer top surface introduces a potential for causing damage at the clamp-to-wafer interface. Another conventional option for securing the wafer within the chamber includes using an electrostatic chuck to pull the wafer down to a support. Use of an electrostatic chuck can increase the complexity of the chamber design. For example, if the chamber is designed with a pressure boundary, the equipment associated with the electrostatic chuck (e.g., power supply) must be compatible with maintaining the integrity of the pressure boundary. The conventional options for securing the wafer in the chamber can be problematic with respect to wafer damage and implementation complexity, particularly when the chamber incorporates a pressure boundary. To ensure the integrity of the wafer and to simplify the chamber design, it is preferable to secure the wafer within the chamber without the use of clamps contacting the wafer top surface and without the use of an electrostatic chuck.

In view of the foregoing, there is a need for a wafer clamping apparatus that will effectively secure the wafer within the chamber during wafer processing. The wafer clamping apparatus should be implemented without contacting the wafer top surface and with minimal increase in chamber design complexity.

SUMMARY OF THE INVENTION

Broadly speaking, the present invention fills these needs by providing a wafer clamping apparatus capable of securing a wafer within a chamber during wafer processing. More specifically, the wafer clamping apparatus of the present invention creates a pressure differential between a top surface and a bottom surface of the wafer. The pressure differential serves to pull the wafer toward a wafer support structure in contact with the wafer bottom surface, whereby the wafer is secured and maintained in an immobile state. The wafer clamping apparatus also includes options for controlling the pressure differential between the top and bottom surfaces of the wafer. One option involves actively and independently controlling both a pressure above the wafer and a pressure below the wafer. Another option involves actively controlling the pressure above the wafer while venting the pressure below the wafer, wherein the venting can be passively or actively controlled. It should be appreciated that the present invention can be implemented in numerous ways, including as a process, an apparatus, a system, a device, or a method. Several embodiments of the present invention are described below.

In one embodiment, a wafer clamping apparatus is disclosed. The wafer clamping apparatus includes a wafer support structure having a number of wafer support surfaces. A lower volume is defined within the wafer support structure between the number of wafer support surfaces. The lower volume exists below a wafer to be disposed on the number of wafer support surfaces. The wafer clamping apparatus also includes an upper volume defined above the wafer to be disposed on the number of wafer support surfaces. An evacuation source is configured to de-pressurize the lower volume. De-pressurization of the lower volume causes a pressure in the upper volume to be higher than a pressure in the lower volume. The lower pressure in the lower volume causes the wafer to remain disposed on the number of wafer support surfaces.

In another embodiment, a wafer processing chamber is disclosed. The wafer processing chamber includes a lower plate configured to receive a wafer. The lower plate has a number of wafer support structures dispersed within a volume configured to underlie the wafer. The wafer processing chamber also includes an upper plate overlying the lower plate. The upper plate has an overlying volume configured to overlie the wafer to be received by the lower plate. An inlet for supplying a fluid to the overlying volume is also provided. The fluid supplied from the inlet is capable of pressurizing the overlying volume. Also, the fluid is capable of entering the underlying volume by traversing between the lower plate and the wafer to be received by the lower plate. The wafer processing chamber also includes an outlet for controlling the pressure in the underlying volume. The outlet is capable of being controlled to cause a pressure in the underlying volume to be lower than a pressure in the overlying volume. The lower pressure in the underlying volume causes the wafer to be forced toward the lower plate.

In another embodiment, a method for clamping a wafer using pressure control is disclosed. In the method, a wafer is disposed on a wafer support. The method further includes decreasing a pressure below the wafer to be lower than a pressure above the wafer. The decreased pressure below the wafer serves to hold the wafer toward the wafer support.

Other aspects and advantages of the invention will become more apparent from the following detailed description, taken in conjunction with the accompanying drawings, illustrating by way of example the present invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

Broadly speaking, an invention is disclosed for a wafer clamping apparatus capable of securing a wafer within a chamber during wafer processing. More specifically, the wafer clamping apparatus creates a pressure differential between a top surface and a bottom surface of the wafer. The pressure differential serves to pull the wafer toward a wafer support structure in contact with the wafer bottom surface, whereby the wafer is secured and maintained in an immobile state. The wafer clamping apparatus also includes options for controlling the pressure differential between the top and bottom surfaces of the wafer. One option involves actively and independently controlling both a pressure above the wafer and a pressure below the wafer. Another option involves actively controlling the pressure above the wafer while venting the pressure below the wafer, wherein the venting can be passively or actively controlled. The wafer clamping apparatus is implemented without requiring contact with the wafer top surface and with minimal increase in chamber design complexity.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
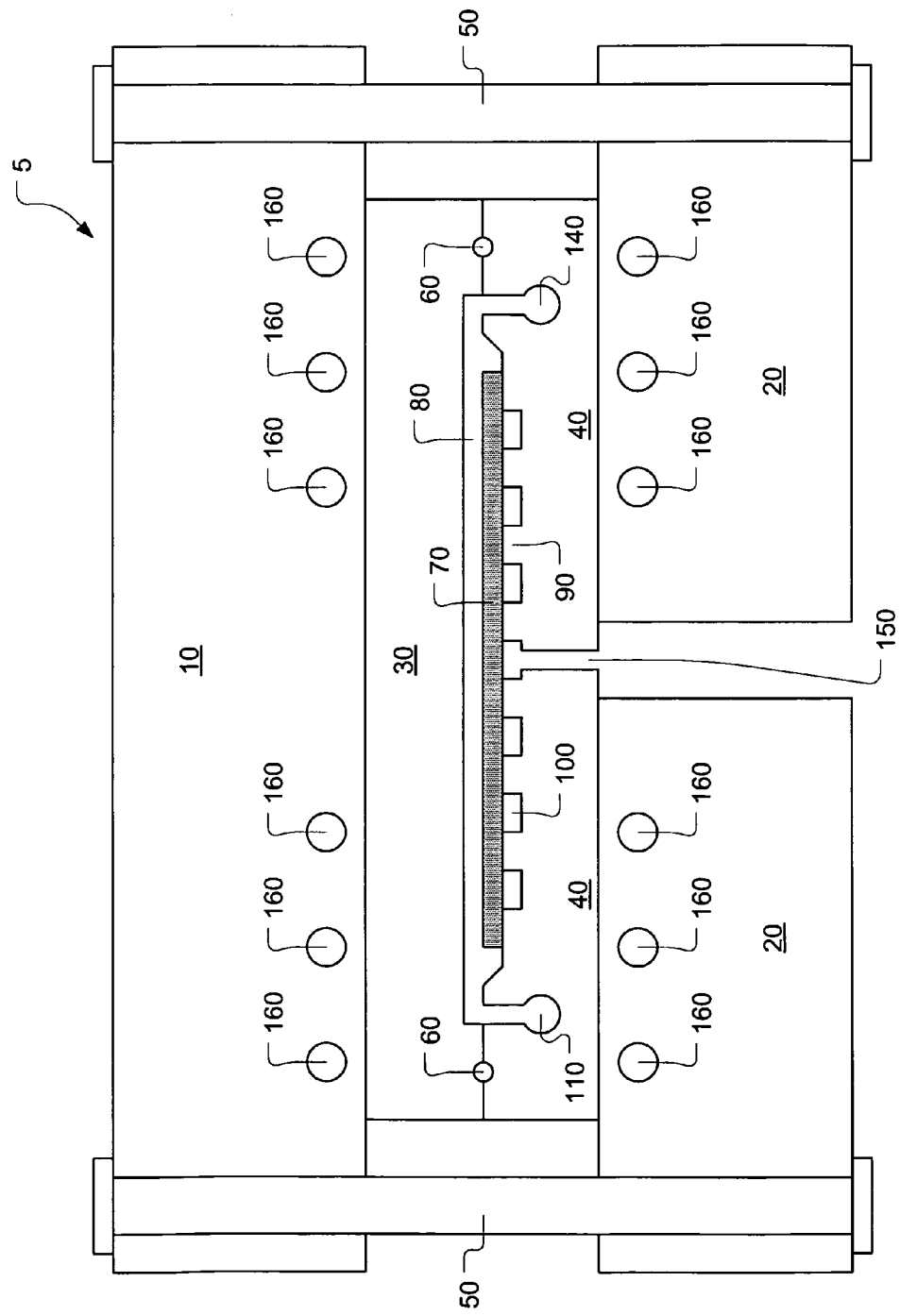
FIG. 1 is an illustration showing a cross-section view of a wafer processing chamber ("chamber"), in accordance with one embodiment of the present invention.

FIG. 1 is an illustration showing a cross-section view of a wafer processing chamber ("chamber") 5, in accordance with one embodiment of the present invention. The chamber 5 includes a lower plate 40 which serves in part as a wafer support structure. The lower plate 40 includes a number of wafer support surfaces 90 distributed to provide substantially uniform support to a wafer 70 to be disposed within the chamber 5. The number of wafer support surfaces 90 are separated to form a lower volume 100. The lower volume 100 is located beneath the wafer 70 to be disposed on the lower plate 40. Hence, with respect to the wafer 70, the lower volume 100 is also referred to as an underlying volume 100. An outlet 150 is provided to remove fluids from the lower volume 100.

The chamber 5 also includes an upper plate 30 that is configured to interface with a top portion of the lower plate 40. The upper plate 30 includes an upper volume 80 defined above the wafer 70. The upper volume 80 is configured to overlie the wafer 70 when the upper plate 30 is attached to the lower plate 40. Hence, with respect to the wafer 70, the upper volume 80 is also referred to as an overlying volume 80.

A fluid for use in a wafer processing operation can be supplied to the upper volume 80 through an inlet 110. In one embodiment, the inlet 110 includes a fluid supply pathway disposed within the lower plate 40. In another embodiment, the fluid supply pathway of the inlet 110 can be disposed within the upper plate 30. In either embodiment, the fluid supply pathway is in fluid communication with the upper volume 80 through a number of inlet nozzles.

The fluid for use in the wafer processing operation can be removed from the upper volume 80 through an outlet 140. In one embodiment, the outlet 140 includes a fluid removal pathway disposed within the lower plate 40. In another embodiment, the fluid removal pathway of the outlet 140 can be disposed within the upper plate 30. In either embodiment, the fluid removal pathway is in fluid communication with the upper volume 80 through a number of outlet nozzles. Thus, the fluid can be supplied through the inlet 110, flow through the upper volume 80 across a top surface of the wafer, and exit through the outlet 140.

A seal 60 is disposed between the upper plate 30 and the lower plate 40 at a peripheral location where the upper plate 30 and the lower plate 40 are in contact. The seal 60 traverses the periphery of the upper volume 80 and serves to isolate the upper volume 80 from an outside environment. To enable the seal 60, the upper plate 30 and lower plate 40 are forced together.

An upper support plate 10 is disposed above the upper plate 30, and a lower support plate 20 is disposed below the lower plate 40. A number of bolts 50 are utilized at peripheral locations to hold the upper support plate 10 and the lower support plate 20 together. The number of bolts 50 are tightened to pull the upper support plate 10 toward the lower support plate 20. As the upper support plate 10 is pulled toward the lower support plate 20, the upper plate 30 will be forced toward the lower plate 40. This forcing of the upper plate 30 toward the lower plate 40 causes the seal 60 to be enabled. The upper support plate 10 provides backing support for the upper plate 30. Similarly, the lower support plate 20 provides backing support for the lower plate 40. Some wafer processes must be performed at extremely high pressures. Thus, the upper support plate 10, the lower support plate 20, and the bolts 50 provide sufficient strength to withstand the pressure which may exist within the upper volume 80. Additionally, some wafer processes must be performed at specific temperatures. In order to provide temperature control within the upper volume 80, across the wafer 70, and within the lower volume 100, thermal control devices 160 can be disposed within the upper support plate 10 and the lower support plate 20. In one embodiment, the thermal control devices 160 can include heat exchanger fluid pathways. In another embodiment, the thermal control devices 160 can include electric heating elements. In either embodiment, conduction through the upper plate 30 and lower plate 40 provide a transfer mechanism to move heat from the thermal control devices 160 to the regions of interest (e.g., upper volume 80, wafer 70, or lower volume 100).

Figure 2:
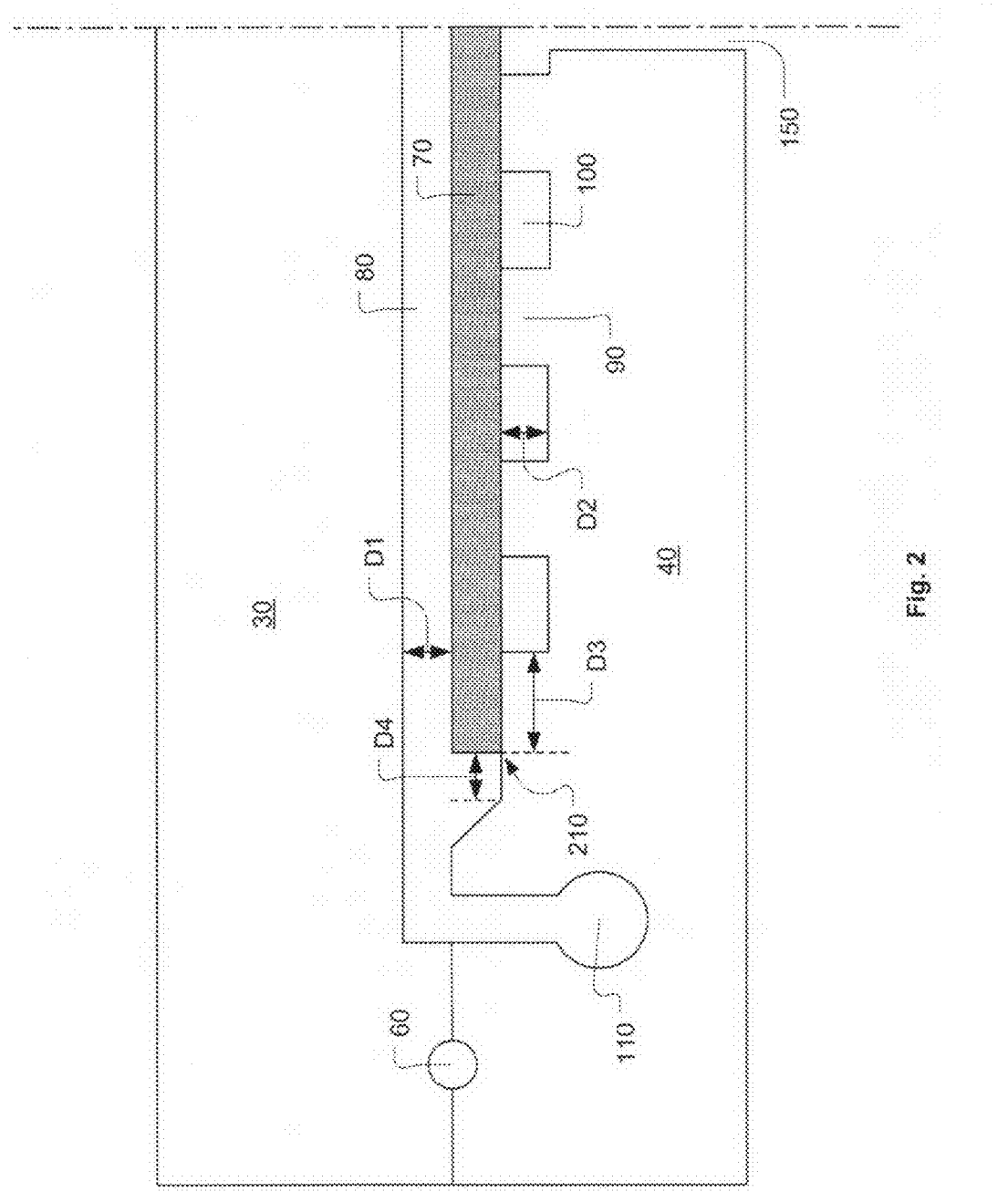
FIG. 2 is an illustration showing close-up view of the interface between the upper plate and the lower plate, in accordance with one embodiment of the present invention.

FIG. 2 is an illustration showing close-up view of the interface between the upper plate 30 and the lower plate 40, in accordance with one embodiment of the present invention. The close-up view shows a vertical cross-section of the upper plate 30 and the lower plate 40 across half of the chamber. As discussed with respect to FIG. 1, the lower plate 40 serves as the wafer support structure having the number of wafer support surfaces 90 upon which the wafer 70 will be secured during wafer processing. The lower volume or underlying volume 100 is formed between the wafer support surfaces 90 and below the wafer 70. The outlet 150 for removing fluids from the lower volume 100 is shown disposed approximately at the center of the lower plate 40. In other embodiments, the outlet 150 can be disposed at other locations within the lower plate 40. The inlet 110 for supplying fluid to the upper volume 80 is also shown as being disposed within the lower plate 40.

The upper volume 80 is formed within the upper plate 30 to overlie the wafer 70 when the upper plate 30 is joined with the lower plate 40. The seal 60 is shown positioned near the periphery of the upper plate 30 and the lower plate 40, and outside the upper volume 80. The seal 60 isolates the upper volume 80 from the outside environment. Since the wafer 70 is not hermetically sealed to the lower plate 40 during wafer processing, the upper volume 80 will be in fluid communication with the lower volume 100 through a limited fluid communication pathway 210 at the periphery of the wafer 70. The limited fluid communication pathway 210 is essentially the area between the wafer 70 and the peripheral wafer support surface 90 of the lower plate 40.

During operation, the pressure in the upper volume 80 will be maintained at a higher level than the pressure in the lower volume 100, thus creating a pressure differential through the wafer 70 from top to bottom. The pressure differential serves to pull the wafer 70 toward the lower plate 40 with sufficient force to secure the wafer 70 to the wafer support surfaces 90. Since the pressure in the upper volume 80 is higher than the pressure in the lower volume 100, some fluid will pass from the upper volume 80 through the limited fluid communication pathway 210 to the lower volume 100. The outlet 150 can be used to remove fluid from the lower volume 100 as necessary. In one embodiment, the outlet has a diameter of about 0.25 inch. However, in other embodiments, the outlet can have a different diameter. As used herein, the term "about" means within ±10% of a specified value.

The dimensions of the upper volume 80, lower volume 100, and wafer support surfaces 90 can vary depending upon the requirements (e.g., pressure, fluid flow rate, fluid composition, etc . . . ) of the wafer process to be performed. In one embodiment, a separation distance D1 between the upper plate 30 and the wafer 70 top surface is about 0.04 inch. However, in other embodiments different values for D1 may be used. In one embodiment, a depth D2 of the lower volume 100 between the wafer 70 and the lower plate 40 can be within a range extending from about 0.005 inch to about 0.04 inch. In particular embodiment, the depth D2 is about 0.02 inch. In one embodiment, an overlap distance D3 between the wafer 70 and the peripheral wafer support surface 90 can be within a range extending from about 0.1 inch to about 0.5 inch. In a particular embodiment, the overlap distance D3 is about 0.25 inch. The overlap distance D3 is a key factor in establishing the pressure drop between the upper volume 80 and the lower volume 100, through the limited fluid communication pathway 210. In one embodiment, a wafer positioning tolerance D4 (i.e., nominal distance between the wafer 70 edge and a wafer pocket perimeter within the lower plate 40) can be within a range extending from about 0.025 inch to about 0.1 inch. The wafer positioning tolerance D4 may be dictated by a precision of a robotic wafer handling device.

The wafer support surfaces 90 are configured to contact a percentage of the wafer 70 commensurate with the pressure differential to be applied through the wafer 70. A higher pressure differential requires a higher percentage of the wafer 70 to be in contact with the wafer support surfaces 90. In one embodiment, the wafer support surfaces 90 can be in contact with a percentage of the wafer 70 surface within a range extending from about 5% to about 80%. In another embodiment, the wafer support surfaces 90 can be in contact with a percentage of the wafer 70 surface within a range extending from about 15% to about 25%. In yet another embodiment, the wafer support surfaces 90 can be in contact with about 20% of the wafer 70 surface. With a differential pressure within a range extending from about 1 atm to about 1.5 atm, the wafer support surfaces 90 can be in contact with a percentage of the wafer 70 surface within a range extending up to about 10%. With a differential pressure within a range extending from about 3 atm to about 4 atm, the wafer support surfaces 90 can be in contact with a percentage of the wafer 70 surface within a range extending from about 50% to about 70%.

It is preferable to minimize the percentage of the wafer in contact with the wafer support surfaces 90 (i.e., wafer backside contact area). Minimization of the wafer backside contact area, however, should be performed in a manner that provides sufficient support for the particular pressure differential to be applied between the volume above the wafer and the volume below the wafer. Minimizing the wafer backside contact area serves to reduce the potential for wafer contamination. Also, minimizing the wafer backside contact area reduces the potential for particles becoming lodged between the wafer and the wafer support surfaces 90, which could cause difficulty in clamping the wafer.

Figure 3:
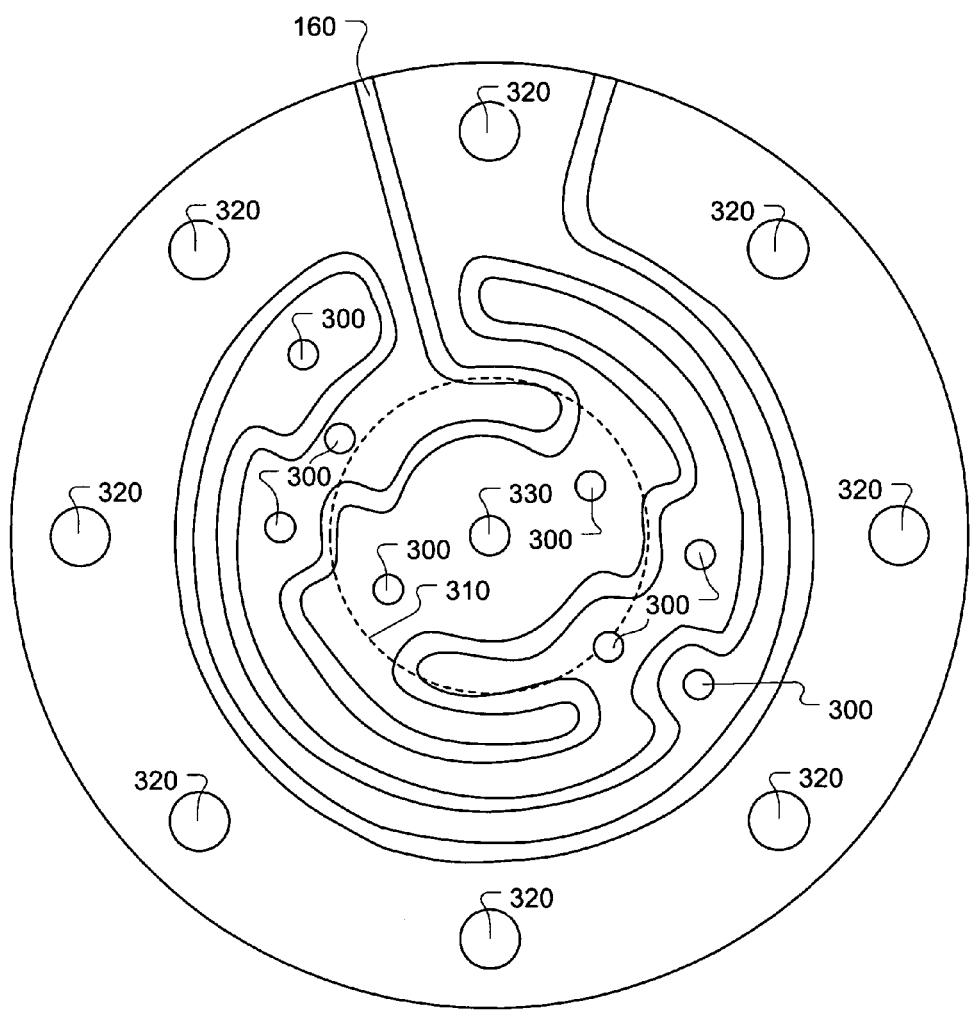
FIG. 3 is an illustration showing a plan view of the lower support plate, in accordance with one embodiment of the present invention.

FIG. 3 is an illustration showing a plan view of the lower support plate 20, in accordance with one embodiment of the present invention. As previously discussed, the lower support plate 20 includes a number of holes 320 through which bolts 50 are passed to secure the lower support plate 20 to the upper support plate 10. The lower support plate 20 also includes the thermal control device 160. In the embodiment of FIG. 3, the thermal control device 160 is depicted as a heat exchanger fluid pathway configured to substantially traverse a region of the lower support plate 20 to be in contact with the lower plate 40. The thermal control device 160 of FIG. 3 is shown for exemplary purposes only. In other embodiments, the thermal control device 160 can be configured differently and/or incorporate alternate components such as electric heating elements. For illustrative purposes, the area over which the wafer 70 will be disposed is depicted by a line 310. An access port 330 is provided within the lower support plate 20 to allow access to the outlet 150 for removing fluid from the lower volume 100. Additionally, a number of access ports 300 are provided within the lower support plate 20. Some of the number of access ports 300 can be configured to access different regions such as the upper volume 80 or the lower volume 100. The number of access ports 300 can be used to insert pressure monitoring devices, temperature monitoring devices, viewing devices, or any combination thereof.

Figure 4:
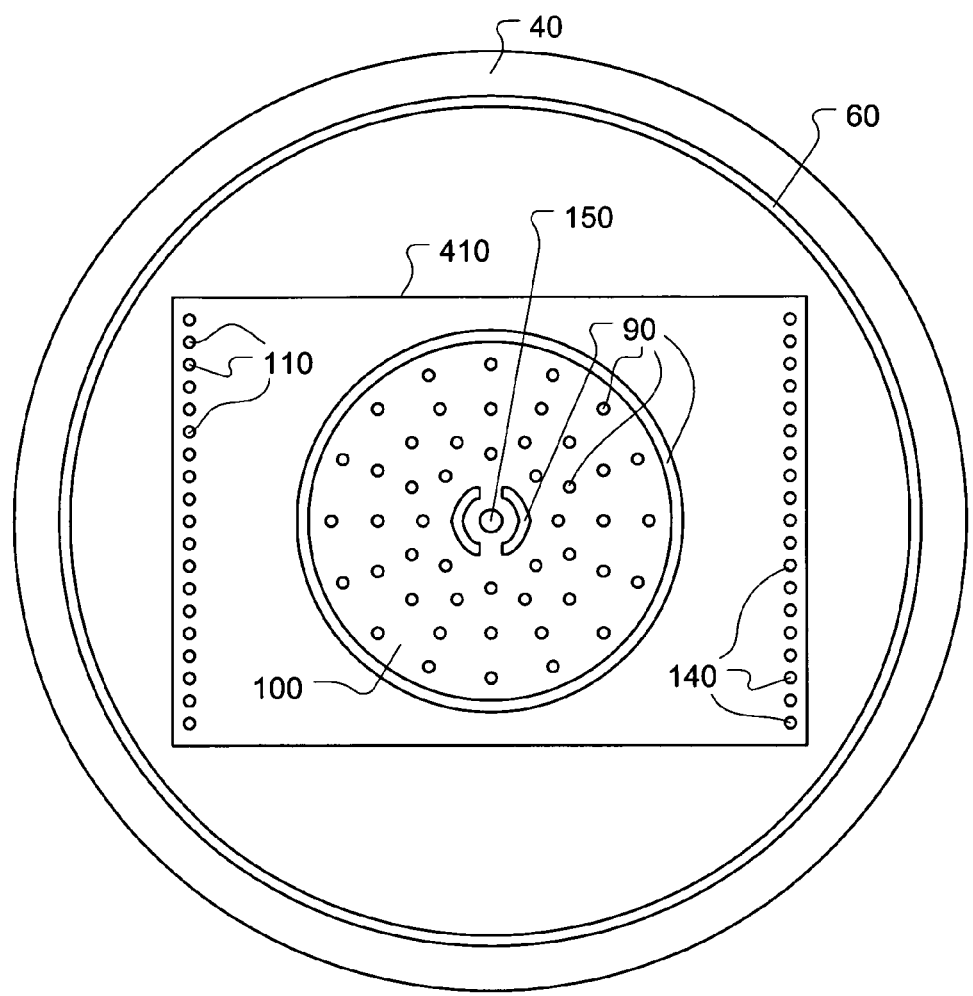
FIG. 4 is an illustration showing a plan view of the lower plate, in accordance with one embodiment of the present invention.

FIG. 4 is an illustration showing a plan view of the lower plate 40, in accordance with one embodiment of the present invention. The seal 60 is shown traversing the periphery of the lower plate 40. Toward the center of the lower plate 40, the number of wafer support surfaces 90 are shown. The number of wafer support surfaces 90 are distributed to contact the wafer 70 in a substantially uniform manner, thus providing substantially uniform resistance to the force transmitted through the wafer by the pressure differential that exists between the upper volume 80 and the lower volume 100. The lower volume 100 occupies the space between the wafer support surfaces 90 below the wafer 70.

The number of inlet nozzles referred to in the description of FIG. 1 are shown as items 420 in FIG. 4. Also, the number of outlet nozzles referred to in the description of FIG. 1 are shown as items 430 in FIG. 4. Fluid used to perform the wafer processing enters through the inlet nozzles 420 into the upper volume 80 and exits through the outlet nozzles 430. In this manner, the fluid flows from the inlet nozzles 420 to the outlet nozzles 430 across the top surface of the wafer 70. Hence, the fluid generally flows within a region 410. However, a small amount of fluid may enter between the region 410 and the seal 60. In one embodiment, a number of weep holes are provided for removal of the fluid that enters between the region 410 and the seal 60.

Figure 5:
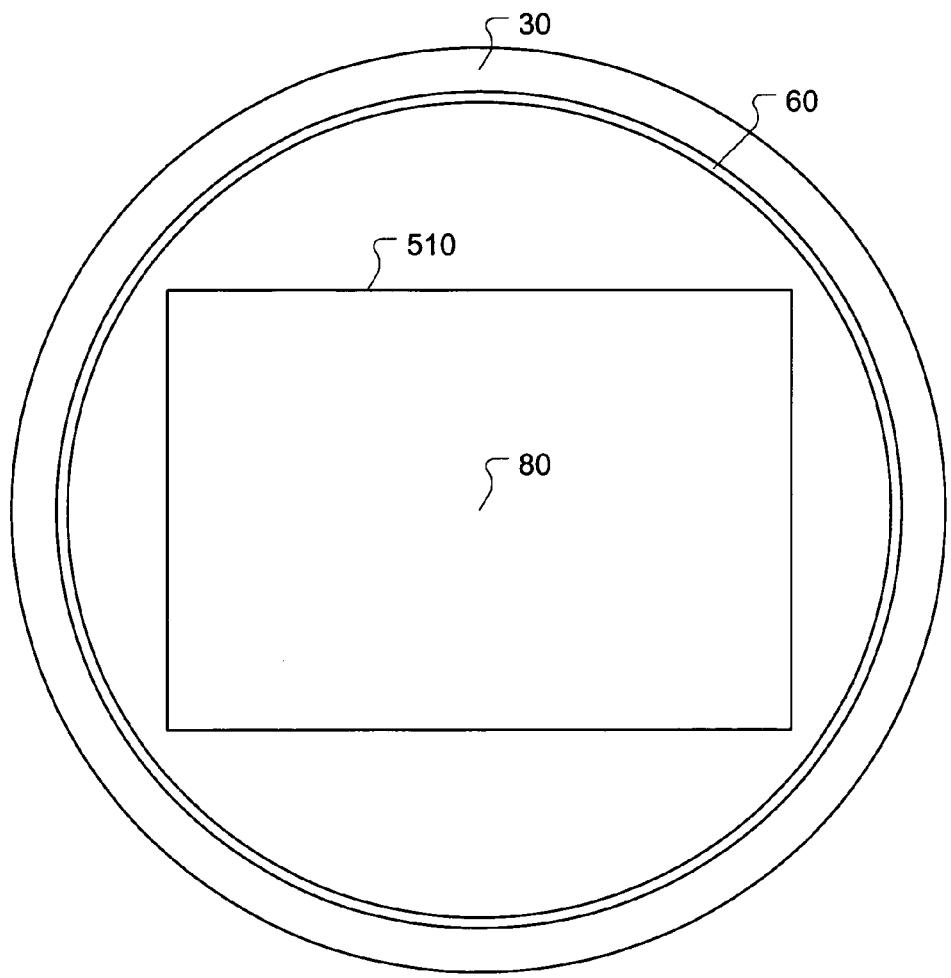
FIG. 5 is an illustration showing a plan view of the upper plate, in accordance with one embodiment of the present invention.

FIG. 5 is an illustration showing a plan view of the upper plate 30, in accordance with one embodiment of the present invention. The seal 60 is shown traversing the periphery of the upper plate 30. A-boundary 510 is shown to depict a perimeter of the upper volume 80. The boundary 510 coincides substantially with the region 410, depicted in FIG. 4. In other embodiments, the boundary 510 and the region 410 may be defined by different shapes.

Figure 6:
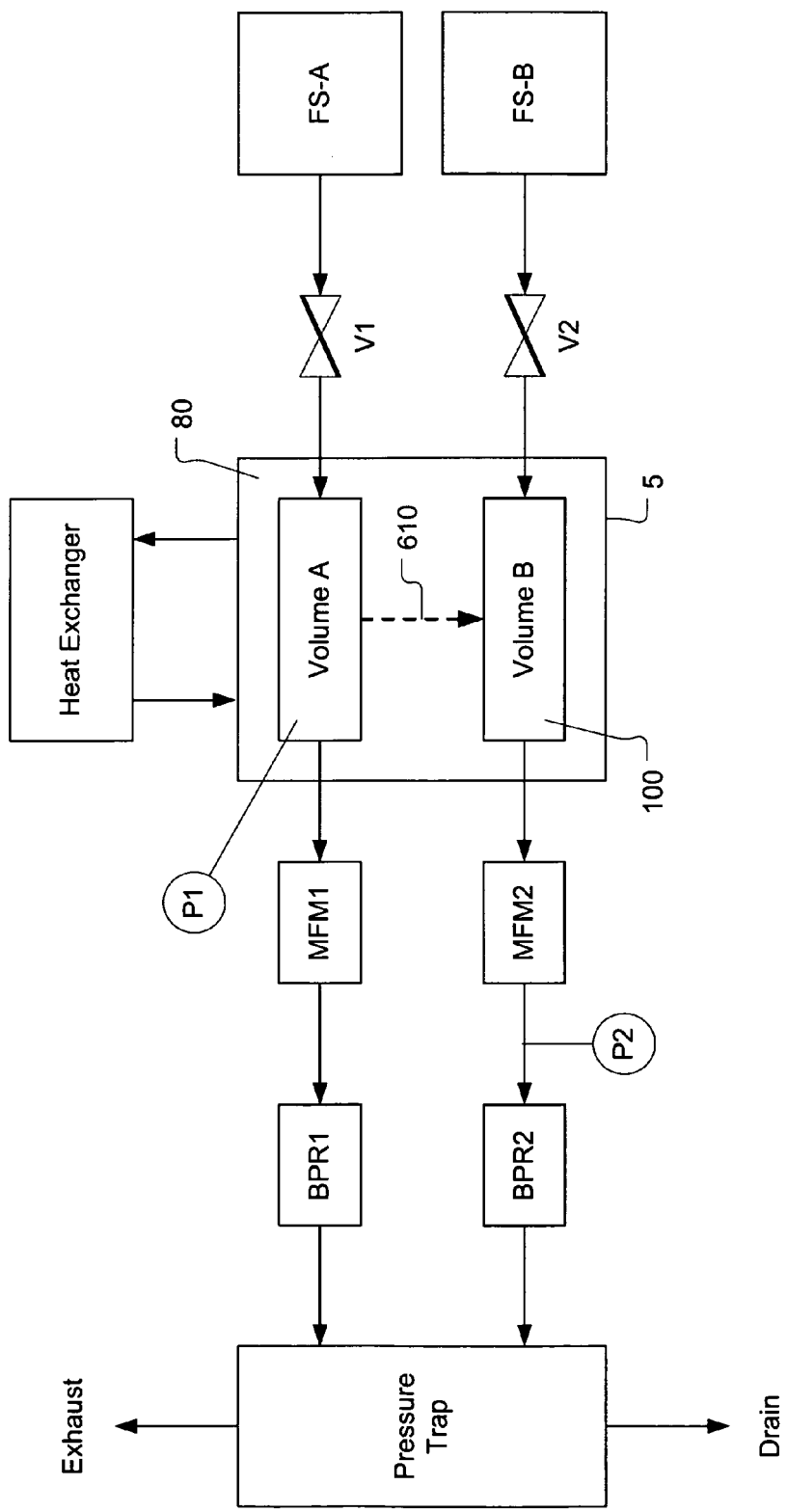
FIG. 6 is an illustration showing a fluid flow system associated with the wafer clamping apparatus, in accordance with one embodiment of the present invention.

FIG. 6 is an illustration showing a fluid flow system associated with the wafer clamping apparatus, in accordance with one embodiment of the present invention. The wafer processing chamber 5 is depicted as having a Volume A and a Volume B. With respect to the wafer processing chamber 5 as previously described, Volume A corresponds to the upper volume 80 located above the wafer 70, and Volume B corresponds to the lower volume 100 located below the wafer 70 and between the wafer support surfaces 90. Volume A is shown to be in limited fluid communication with Volume B by a dashed arrow 610. The limited fluid communication corresponds to the wafer 70 not being hermetically sealed to the lower plate 40, as discussed with respect to FIG. 2. The wafer processing chamber 5 is also shown to have a heat exchanger to provide thermal control within Volume A and Volume B. In other embodiments, different thermal control devices can be incorporated.

The fluid for use in the wafer processing is provided from a fluid source FS-A through a valve V1 to Volume A. The fluid flows through Volume A, through a mass flow meter MFM1, through a back pressure regulator BPR1, to a pressure trap. The mass flow meter MFM1 is used to monitor the fluid flow rate through Volume A. The back pressure regulator BPR1 is used to control the pressure in Volume A. A pressure monitor P1 is also provided for monitoring the pressure in Volume A. The pressure monitor P1 does not have to be located directly over the wafer. However, the pressure monitor P1 should be disposed within Volume A.

The pressure trap is equipped with an exhaust and a drain. The pressure trap is used to maintain a minimum pressure within the fluid flow system.

Some fluid will enter Volume B from Volume A through the limited fluid communication indicated by the arrow 610. The fluid in Volume B flows through Volume B, through a mass flow meter MFM2, through a back pressure regulator BPR2, to the pressure trap. The mass flow meter MFM2 is used to monitor the fluid flow rate through Volume B. An abnormally high fluid flow rate indication by MFM2 could relate to improper seating of the wafer 70 on the wafer support surfaces 90 of the lower plate 40. An improper seating of the wafer 70 is a condition that would require remedy prior to commencement of wafer processing operations. Otherwise, the wafer could potentially lift and become mobile. The back pressure regulator BPR2 is used to control the pressure in Volume B. A pressure monitor P2 is also provided for monitoring the pressure in Volume B. The pressure monitor P2 does not have to be located directly below the wafer. However, the pressure monitor P2 should be disposed along a fluid pathway connected to Volume B.

In one embodiment, the only fluid that enters Volume B is the fluid that traverses the limited fluid communication indicated by the arrow 610. In another embodiment, additional fluid can be supplied to Volume B. The additional fluid is provided from a fluid source FS-B through a valve V2 to Volume B. The additional fluid source FS-B can be used to actively control the pressure within Volume B.

During operation, the pressure within Volume A and Volume B are monitored by pressure monitors P1 and P2, respectively. The difference between the pressures indicated by pressure monitors P1 and P2 represents a differential pressure acting through the wafer from top to bottom. A particular wafer processing operation may require a particular force to secure the wafer to the wafer support surfaces 90 of the lower plate 40. The differential pressure determined from P1 and P2 can be used to monitor the force being used to the secure the wafer. The back pressure regulators BPR1 and BPR 2 can be used to control the pressures in Volume A and Volume B, respectively, thus maintaining a desired differential pressure. The desired differential pressure can depend on several wafer processing parameters such as fluid flow rate across the wafer, percentage of the wafer surface contacting wafer support surfaces 90, and wafer thickness, among others. For example, the differential pressure can be maintained within a range extending from about 1 atm to about 10 atm in one embodiment. In another exemplary embodiment, the differential pressure can be maintained at about 2 atm.

Figure 7:
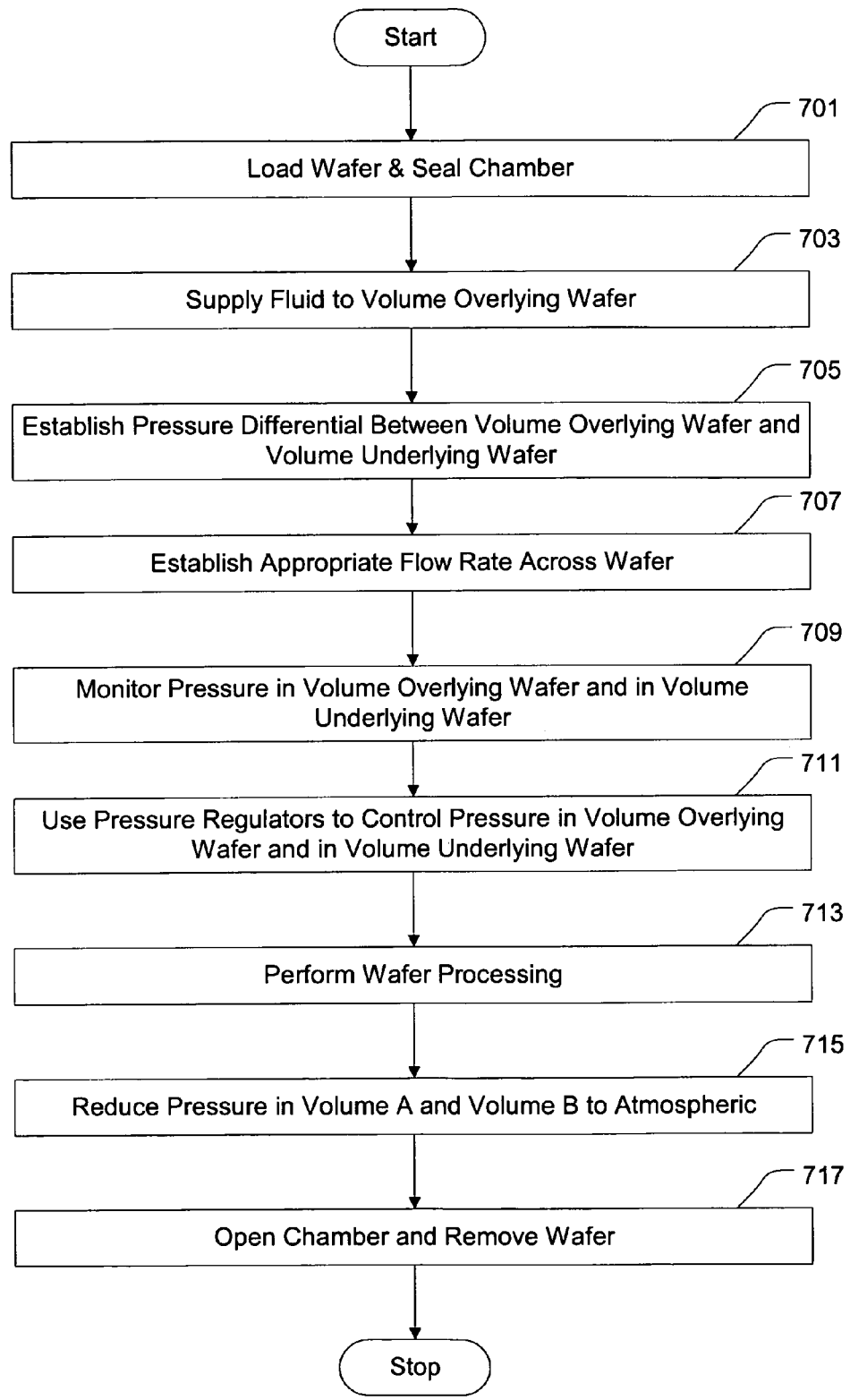
FIG. 7 is an illustration showing a flowchart of a method for clamping a wafer using active and independent pressure control both above and below the wafer, in accordance with one embodiment of the present invention.

FIG. 7 is an illustration showing a flowchart of a method for clamping a wafer using active and independent pressure control both above and below the wafer, in accordance with one embodiment of the present invention. The method starts with an operation 701 in which the wafer is loaded into a chamber and the chamber is sealed. In an operation 703, a fluid is supplied to a volume overlying the wafer within the chamber. The fluid is formulated to effect a wafer processing operation. In an operation 705, a pressure differential is established between the volume overlying the wafer and a volume underlying the wafer. The pressure differential serves to pull the wafer down toward a wafer support structure within the chamber. The method continues with an operation 707 in which an appropriate fluid flow rate is established across a top surface of the wafer. The appropriate fluid flow rate is determined based on requirements of the wafer processing operation to be performed. In an operation 709, both a pressure in the volume overlying the wafer and a pressure in the volume underlying the wafer are monitored. In an operation 711, pressure regulators are used to actively and independently control each of the pressure in the volume overlying the wafer and the pressure in the volume underlying the wafer. The pressure regulators allow a target pressure differential to be maintained between the volume overlying the wafer and the volume underlying the wafer. The target pressure differential causes the wafer to be pulled toward the wafer support structure with a specific amount of force. The force causes the wafer to be secured, thus remaining immobile during the wafer processing operation. In an operation 713, the wafer processing is performed. Upon completion of the wafer processing, an operation 715 is performed in which the pressures in both the volume overlying the wafer and the volume underlying the wafer are reduced to atmospheric pressure. The method concludes with an operation 717 in which the chamber is opened and the wafer is removed.

Figure 8:
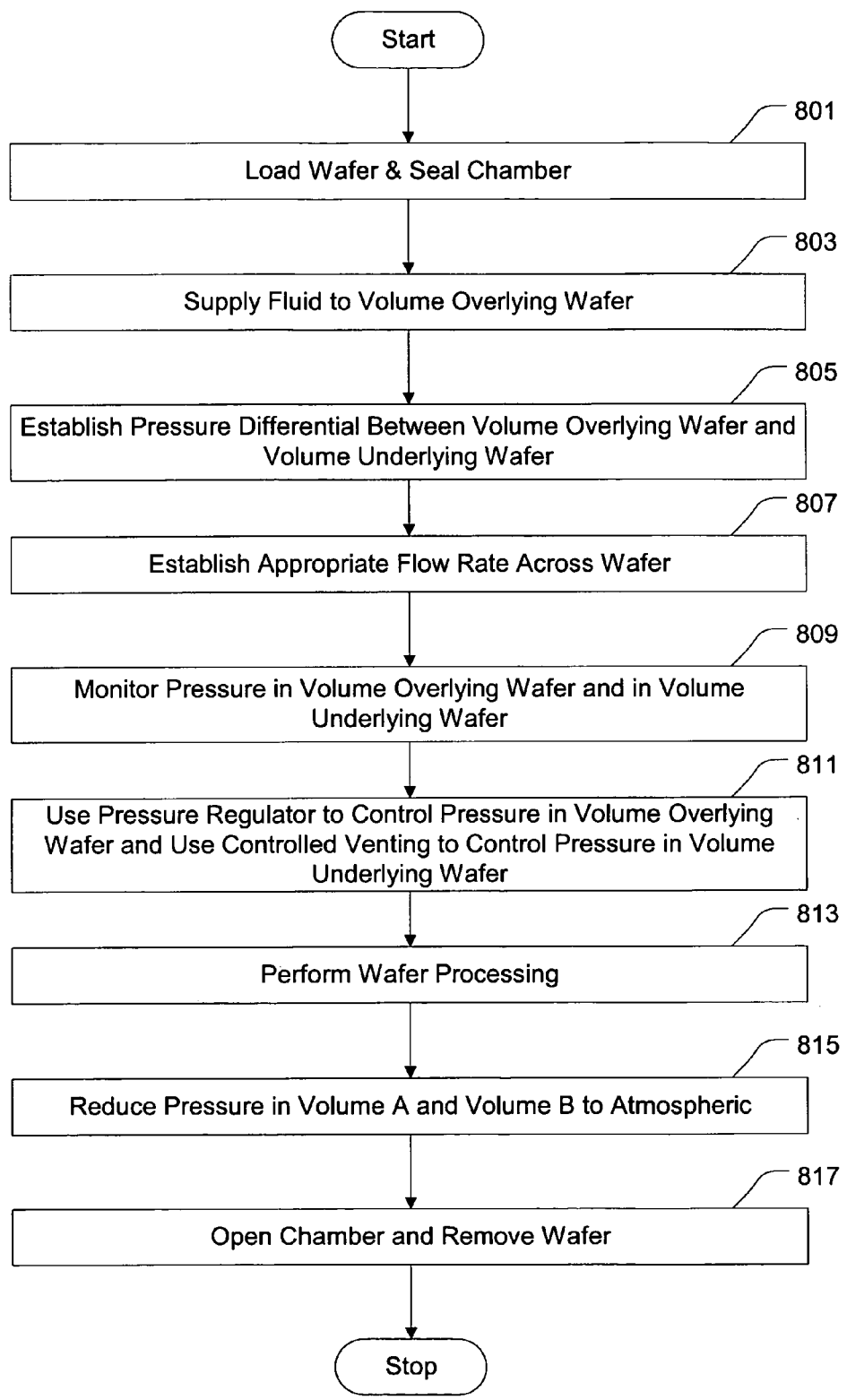
FIG. 8 is an illustration showing a flowchart of a method for clamping a wafer using active pressure control above the wafer and controlled venting below the wafer, in accordance with one embodiment of the present invention.

FIG. 8 is an illustration showing a flowchart of a method for clamping a wafer using active pressure control above the wafer and controlled venting below the wafer, in accordance with one embodiment of the present invention. The method starts with an operation 801 in which the wafer is loaded into a chamber and the chamber is sealed. In an operation 803, a fluid is supplied to a volume overlying the wafer within the chamber. The fluid is formulated to effect a wafer processing operation. In an operation 805, a pressure differential is established between the volume overlying the wafer and a volume underlying the wafer. The pressure differential serves to pull the wafer down toward a wafer support structure within the chamber. The method continues with an operation 807 in which an appropriate fluid flow rate is established across a top surface of the wafer. The appropriate fluid flow rate is determined based on requirements of the wafer processing operation to be performed. In an operation 809, both a pressure in the volume overlying the wafer and a pressure in the volume underlying the wafer are monitored. In an operation 811, a pressure regulator is used to control the pressure in the volume overlying the wafer. Also, in the operation 811, the volume underlying the wafer is vented in a controlled manner. Use of the pressure regulator in combination with the controlled venting allows a target pressure differential to be maintained between the volume overlying the wafer and the volume underlying the wafer. The target pressure differential causes the wafer to be pulled toward the wafer support structure with a specific amount of force. The force causes the wafer to be secured, thus remaining immobile during the wafer processing operation. In an operation 813, the wafer processing is performed. Upon completion of the wafer processing, an operation 815 is performed in which the pressures in both the volume overlying the wafer and the volume underlying the wafer are reduced to atmospheric pressure. The method concludes with an operation 817 in which the chamber is opened and the wafer is removed.

The wafer clamping apparatus of the present invention is well suited for use in a wafer process that utilizes a supercritical fluid. As previously described, the wafer clamping apparatus is enabled by controlling a pressure differential between a top surface and a bottom surface of the wafer. The pressure differential serves to pull the wafer toward a wafer support structure in contact with the wafer bottom surface, whereby the wafer is secured and maintained in an immobile state. In supercritical fluid wafer processing, the pressure must also be controlled within the vicinity of the wafer to maintain the supercritical state of the fluid.

Figure 9:
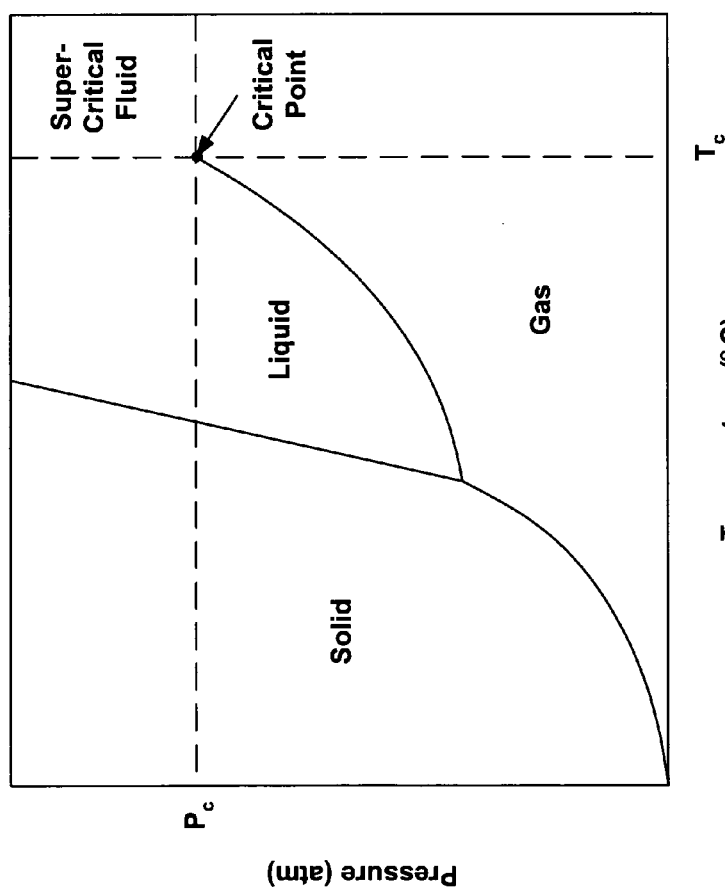
FIG. 9 is an illustration showing a generalized material phase diagram.

FIG. 9 is an illustration showing a generalized material phase diagram. The phase of the material is represented as regions of solid, liquid, and gas, wherein the presence of a particular phase is dependent on pressure and temperature. The gas-liquid phase boundary follows an increase in both pressure and temperature up to a point called the critical point. The critical point is delineated by a critical pressure ($P_c$) and a critical temperature ($T_c$). At pressures and temperatures beyond $P_c$ and $T_c$, the material becomes a supercritical fluid.

Wafer cleaning operations can be performed using the supercritical fluid. The supercritical fluid shares the properties of both a gas phase and a liquid phase. The supercritical fluid has near zero surface tension. Therefore, the supercritical fluid can reach into and between small features on the wafer surface. Also, the supercritical fluid has a diffusivity property similar to a gas. Therefore, the supercritical fluid can get into porous regions of wafer materials, such as low-K dielectric material, without becoming trapped. Additionally, the supercritical fluid has a density similar to a liquid. Therefore, more supercritical fluid can be transported to the wafer in a given amount of time as compared to a gas.

Wafer processing with the supercritical fluid must be performed at high pressures to maintain the supercritical state of the fluid. Therefore, the wafer processing chamber must be able to withstand the associated high pressures. The wafer processing chamber described in conjunction with the wafer clamping apparatus of the present invention is capable of withstanding high pressures associated with supercritical fluids.

Generally speaking, the chamber is pressurized and the temperature within the chamber is controlled. The chamber pressure and temperature are controlled to maintain a supercritical fluid state. In an exemplary embodiment, the chamber can be pre-pressurized with $CO_2$ only or with a mixture of $CO_2$ and an appropriate chemistry. The critical pressure and temperature for $CO_2$ is approximately 73 atm and 31° C., respectively. It should be noted that the supercritical fluid used in combination with the wafer clamping apparatus is not restricted to $CO_2$. Other suitable supercritical fluids can also be used. Additionally, the chemistry of the supercritical fluid may include additives such as co-solvents, co-chelating agents, surfactants, or any combination thereof. The additives contained within the supercritical fluid can be useful for performing specific functions, such as dissolving and removing photoresist, dissolving and removing organic residue, and chelating metals, among others.

The wafer clamping apparatus of the present invention can be incorporated into a wafer processing chamber that is part of a wafer processing cluster architecture. In one example, the wafer processing cluster architecture can incorporate separate modules for performing wafer cleaning operations, wafer etching operations, CMP operations, and wafer rinsing operations. Additionally, in the wafer processing cluster architecture, the wafer can be transferred between different modules using a robotic wafer handling mechanism or a track mechanism.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A wafer clamping apparatus, comprising:
a lower plate having a wafer receipt area, the wafer receipt area including a first recessed area and a number of wafer support surfaces disposed in a substantially uniform manner throughout the first recessed area such that when a wafer is supported on the number of wafer support surfaces a lower volume exists within the lower plate between the number of wafer support surfaces, the lower plate including a number of fluid inlet nozzles defined to supply a fluid to a processing volume overlying the wafer receipt area, the lower plate including a number of fluid outlet nozzles defined to remove the fluid from the processing volume overlying the wafer receipt area;
an upper plate defined to interface with the lower plate, the upper plate including a second recessed area defined to overly the wafer receipt area so as to form the processing volume when the upper plate is interfaced with the lower plate; and
an evacuation source in fluid communication with the lower volume such that when operated the evacuation source causes the wafer to be held in contact with the number of wafer support surfaces.

2. A wafer clamping apparatus as recited in claim 1, wherein the pressure in the processing volume is higher than the pressure in the lower volume by an amount within a range extending from about 1 atm to about 4 atm.

3. A wafer clamping apparatus as recited in claim 1, further comprising:
a limited fluid communication pathway between the processing volume and the lower volume.

4. A wafer clamping apparatus as recited in claim 1, wherein the fluid is a supercritical fluid.

5. A wafer clamping apparatus as recited in claim 1, further comprising:
a pressurization source configured to pressurize the processing volume, pressurization of the processing volume providing a control of a differential pressure between the processing volume and the lower volume, the control of the differential pressure continuing to cause the pressure in the processing volume to be higher than the pressure in the lower volume.

6. A wafer clamping apparatus as recited in claim 1, further comprising:
a pressurization source configured to pressurize the lower volume, pressurization of the lower volume providing a control of a differential pressure between the processing volume and the lower volume, the control of the differential pressure continuing to cause the pressure in the processing volume to be higher than the pressure in the lower volume.

7. A wafer clamping apparatus as recited in claim 1, further comprising:
a seal to isolate the processing volume and the lower volume from an outside environment.

8. A wafer clamping apparatus as recited in claim 1, further comprising:
an processing volume pressure monitor and a lower volume pressure monitor, the processing volume pressure monitor and the lower volume pressure monitor being used to provide pressure information for controlling the pressure in the processing volume and the pressure in the lower volume.

9. A wafer processing chamber, comprising:
a lower plate including a recessed area bounded by a peripheral wafer support, the peripheral wafer support defined to provide a continuous support surface for a peripheral region of a backside of a wafer to be received by the lower plate, the lower plate including a number of wafer support structures dispersed within the recessed area so as to form an underlying volume between the number of wafer support structures and below the wafer to be received by the lower plate;
an upper plate overlying the lower plate, the upper plate having an overlying volume configured to overlie the wafer to be received by the lower plate, the upper plate defined to contain a supercritical fluid pressure within the overlying volume;
an inlet for supplying a fluid to the overlying volume, the fluid capable of pressurizing the overlying volume to a supercritical state, the fluid also capable of entering the underlying volume only by traversing between the peripheral wafer support of the lower plate and the wafer to be received by the lower plate; and
an outlet for controlling a pressure in the underlying volume, the outlet capable of being controlled to cause a pressure in the underlying volume to be lower than a pressure in the overlying volume, the lower pressure in the underlying volume causing the wafer to be received by the lower plate to be forced toward the lower plate.

10. A wafer processing chamber as recited in claim 9, wherein the inlet for supplying the fluid to the overlying volume is disposed within one of the lower plate, the upper plate, and both the lower plate and the upper plate.

11. A wafer processing chamber as recited in claim 9, further comprising:
a seal disposed between the lower plate and the upper plate, wherein the seal isolates the underlying volume and the overlying volume from an outside environment.

12. A wafer processing chamber as recited in claim 9, further comprising:
an upper support plate disposed above and in contact with the upper plate, the upper support plate configured to reinforce the upper plate; and
a lower support plate disposed below and in contact with the lower plate, the lower support plate configured to reinforce the lower plate, the lower support plate being secured to the upper support plate by a number of bolts.

13. A wafer processing chamber as recited in claim 12, further comprising:
a thermal control device disposed within one of the upper support plate, the lower support plate, and both the upper support plate and the lower support plate.

14. A wafer processing chamber as recited in claim 9, further comprising:
an additional inlet for supplying an additional fluid to the underlying volume; and
an additional outlet for removing the fluid and the additional fluid from the underlying volume, the additional outlet being controlled to maintain the pressure in the overlying volume higher than the pressure in the underlying volume.

15. A wafer processing chamber as recited in claim 9, wherein the fluid is a supercritical fluid.

16. A wafer processing chamber as recited in claim 9, wherein the wafer processing chamber is part of a wafer processing cluster architecture.

* * * * *